US006408264B1

(12) United States Patent
Su et al.

(10) Patent No.: US 6,408,264 B1
(45) Date of Patent: Jun. 18, 2002

(54) SWITCH LEVEL SIMULATION WITH CROSS-COUPLED DEVICES

(75) Inventors: Jason Tzu-Jung Su, Cupertino, CA (US); Howard C. Kirsch, Austin, TX (US); Lidong Chen, Sunnyvale, CA (US)

(73) Assignees: Vanguard International Semiconductor-America; Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/274,211

(22) Filed: Mar. 23, 1999

(51) Int. Cl.$^7$ .............................................. G06F 17/50
(52) U.S. Cl. ................. 703/14; 716/12; 716/4
(58) Field of Search ...................... 703/14–22; 716/1–4, 716/12–16

(56) References Cited

U.S. PATENT DOCUMENTS

| | | | |
|---|---|---|---|
| 4,907,180 A | 3/1990 | Smith | 703/14 |
| 5,051,941 A | 9/1991 | Takamine et al. | 703/15 |
| 5,278,769 A | 1/1994 | Bair et al. | 703/19 |
| 5,297,066 A | 3/1994 | Mayes | 703/14 |
| 5,305,229 A | 4/1994 | Dhar | 703/14 |
| 5,553,008 A | 9/1996 | Huang et al. | 703/14 |
| 5,701,254 A | 12/1997 | Tani | 703/15 |
| 5,703,798 A | 12/1997 | Dhar | 703/14 |
| 5,822,567 A | 10/1998 | Takeuchi | 703/14 |
| 6,190,433 B1 * | 2/2001 | Van Fleet et al. | 703/13 |
| 6,311,146 B1 * | 10/2001 | Hao et al. | 703/14 |

OTHER PUBLICATIONS

Santarini, "Avant! Rolls Event–Driven Timing Tool for Milkyway", Electronic Engineering Times, Issue 988, p. 79 (Jan. 1998).*

Xirgo et al, "Digital MOS Circuit Partitioning with Symbolic Modeling", IEEE Proceedings of the Design, Automation and Test in Europe Conference, pp. 503–508 (Mar. 1999).*

* cited by examiner

Primary Examiner—Russell Frejd
Assistant Examiner—Samuel Broda (57) ABSTRACT

A switch level simulation system includes a netlister, a cross-coupled device detector, a cross-coupled device transformer and a switch level simulator. The user provides a circuit a design to the netlister, which generates a netlist of the circuit. The cross-coupled device detector searches the netlist to find all of the cross-coupled devices in the circuit design. The cross-coupled device detector also determines whether the cross-coupled device has a "rail" node directly connected an external voltage source line. The cross-coupled device transformer transforms each cross-coupled device having a rail node into a transformed cross-coupled device by inserting in the netlist a device at the rail node mirroring the enable device. The mirror device allows the transformed cross-coupled device to provide a high impedance state to emulate the meta-stable state of the cross-coupled device during switch level simulation. The switch level simulator then performs simulations using the netlist with the transformed cross-coupled devices. This technique avoids the need to construct behavioral models of the cross-coupled devices, significantly reducing the engineering resources needed to model cross-coupled devices, while maintaining the accuracy of the switch level simulation.

25 Claims, 7 Drawing Sheets

FIG. 1
SINGLE-MODE (Type $B_N$)

FIG. 2
SINGLE-MODE (Type $B_P$)

FIG. 3
MULTI-MODE (Type $B_N$)

FIG. 4
MULTI-MODE (Type $B_P$)

(Type A)

FIG. 14E

SWITCH LEVEL SIMULATION WITH CROSS-COUPLED DEVICES

FIELD OF THE INVENTION

The present invention relates to simulation of electronic circuits and, more particularly, to switch level simulation.

BACKGROUND INFORMATION

Switch level simulation is commonly used to model the operation of a digital circuit. Typically, each transistor in the digital circuit is modeled with a switch having a conduction path with a delay property. In addition, switch level simulation may also include a strength parameter corresponding to the conductances of the various transistors. Other types of simulation can be used, such as analog simulation (e.g., spice). Switch level simulation generally can be performed much faster than analog modeling (especially for relatively large circuits), while still maintaining accuracy in verifying the logic functionality of the circuit design.

However, one problem with switch level simulation is in modeling circuits with cross-coupled devices. Cross-coupled devices (e.g. sense amplifiers) are commonly used in digital memory circuits, such as DRAMs and SRAMs. Cross-coupled devices have a metastable state that is difficult to model using conventional switch level simulation techniques. In particular, the voltages at complementary nodes of a cross-coupled device may be unknown during operation, which, without accounting for the metastable state, can lead to failure in the modeling. Another difficulty is that cross-coupled devices are sensitive to voltage level changes that may not result in changes in logic level, which are difficult to model using switch level techniques.

One conventional solution to this problem is to use strength allocation techniques in which a cross-coupled device that is "downstream" from another cross-coupled device in a data path is allocated a weaker strength than the upstream cross-coupled device. These techniques allow the upstream cross-coupled device to overwrite the downstream cross-coupled device, causing data to ripple downstream. However, these strength allocation techniques fail when the datapath is bidirectional. In addition, these techniques may not be practical when the datapath contains many stages of cross-coupled devices.

Another conventional solution is to remove all of the cross-coupled devices from the circuit and replace each cross-coupled device with an appropriate "black box". The black box is a behavioral model of the cross-coupled device being replaced. The designer must construct a behavioral model for each cross-coupled device and its associated control circuitry. Because of the complexity of the behavior of cross-coupled devices, constructing these black boxes consumes valuable engineering resources. In addition, the switch level simulation in effect verifies the functionality of the black boxes rather than of the actual cross-coupled devices in the circuit, thereby throwing the accuracy of the entire model into question.

Therefore, what is needed is a technique for modeling cross-coupled devices in a switch level simulation tool that more closely relies on the actual devices in the cross-coupled devices, reduces the consumption of engineering resources, and maintains or improves modeling accuracy relative to conventional techniques.

SUMMARY

In accordance with the present invention, a switch level simulation system having a netlister, a cross-coupled device detector, a cross-coupled device transformer and a switch level simulator is provided. The user provides a circuit design to the netlister, which then generates a netlist of the circuit. The cross-coupled device detector searches the netlist to find all of the cross-coupled devices in the circuit design. In one aspect of the present invention, the cross-coupled device detector also determines whether the cross-coupled device has a "rail" node directly connected an external voltage source line (e.g., VDD or VSS) without an "enable" device (i.e., cross-coupled devices may be enabled by activating a pull-up or pull-down device to complete the differential current paths in the cross-coupled devices). Such a cross-coupled device is referred to herein as a Type B cross-coupled device. The cross-coupled device transformer transforms each Type B cross-coupled device into a transformed cross-coupled device. In one aspect of the present invention, the cross-coupled device transformer inserts a device at the rail node mirroring the enable device. For example, if the Type B cross-coupled device is enabled by activating an N-channel pull-down transistor (which means the rail node is connected to the VDD line), the cross-coupled device transformer inserts an N-channel transistor between the VDD line and the rail node. The mirror device allows the transformed cross-coupled device to provide a high impedance state to emulate the meta-stable state of the cross-coupled device during switch level simulation, thereby maintaining and even improving the accuracy of the simulation. The simple insertion of the mirror device significantly reduces the engineering resources needed to model cross-coupled devices compared to the aforementioned conventional techniques while maintaining a close resemblance to the actual cross-coupled device.

BRIEF DESCRIPTION OF THE DRAWINGS

The forgoing aspects and many of the attendant advantages of this invention will become more readily appreciated by reference to the following detailed description, taken in conjunction with the drawings listed below.

DETAILED DESCRIPTION

Figure 1:
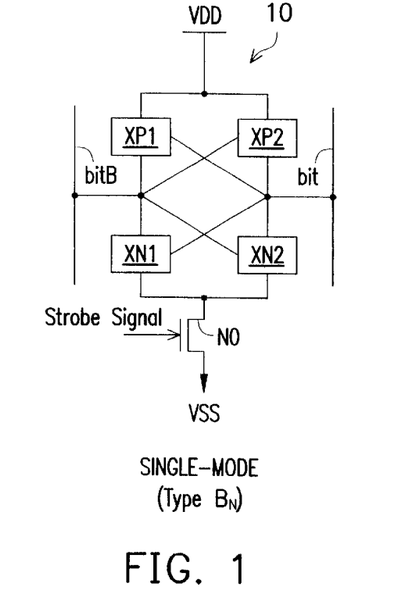
FIG. 1 is a diagram schematically illustrating a type B single-mode sense amplifier with a pull-down device.

In accordance with one aspect of the present invention, cross-coupled devices are categorized into several types. Several examples of the types are described below in conjunction with FIGS. 1–5, using sense amplifiers commonly included in memory devices. Sense amplifiers commonly have an "enable" or "strobe" device that is used to selectively enable the operation of the sense amplifier (e.g., a cross-coupled device may be enabled by activating a pull-up or pull-down device to complete the differential current paths in the cross-coupled devices). As used herein, a type B sense amplifier has a "rail" node connected directly to an external voltage source line (e.g., VDD or VSS) without an "enable" device. Type B devices are categorized into type $B_N$ or type $B_P$ devices, with the subscript indicating the conductivity-type of the enable device. FIG. 1 illustrates a type $B_N$ single-mode sense amplifier 10. Sense amplifier 10 is a standard sense amplifier implementation, which includes a cross-coupled device formed by P-channel transistors XP1 and XP2, N-channel transistors XN1 and XN2, and an enable device implemented with N-channel transistor N0. Although sense amplifier 10 is a standard implementation, its interconnection is described below for completeness.

The sources of P-channel transistors XP1 and XP2 (referred to herein as the P node) are connected to a VDD line. The drains of P-channel transistors XP1 and XP2 are connected to a complementary bitline bitB and a bitline bit, respectively. Bitline bitB is also connected to the drain of N-channel transistor XN1 and the gate of N-channel transistor XN2. Bitline bit is connected to the drain of N-channel transistor XN2 and the gate of N-channel transistor XN1. The sources of N-channel transistors XN1 and XN2 (referred to herein as the N node) are connected to the drain of N-channel transistor N0, which serves as the enable device of sense amplifier 10. The gate of N-channel transistor N0 is connected to receive a strobe signal, whereas the source of N-channel transistor N0 is connected to a VSS line. As will be appreciated by those skilled in the art, the VDD and VSS lines are connected to an external voltage source to provide power to the sense amplifier.

In operation, the strobe signal is forced to a logic high level to enable sense amplifier 10 to amplify the differential signal present on bitlines bitB and bit. When the voltage at bitline bitB is more positive than that at bitline bit and the strobe signal is at a logic high level, transistor XN2 becomes more conductive than transistor XN1, while concurrently, transistor XP1 becomes more conductive than transistor XP2. As a result, transistors XN2 and N0 pull down the voltage at bitline bit relative to bitline bitB, while transistor XP1 tends to pull up the voltage at bitline bitB. This complementary pulling down and pulling up of bitlines bitB and bit are reinforced by each other, thereby turning transistors XP1 and XN2 are turned on hard while transistors XP2 and XN1 are turned off. As a result, the voltages at bitlines bitB and bit are quickly and abruptly forced to the VDD and VSS voltages, respectively.

Conversely, when the voltage at bitline bitB is more negative than that at bitline bit and the strobe signal is at a logic high level, transistor XN2 becomes less conductive than transistor XN1, while concurrently, transistor XP1 becomes less conductive than transistor XP2. As a result, transistors XN1 and N0 pull down the voltage at bitline bitB relative to bitline bit, while transistor XP2 tends to pull up the voltage at bitline bit. This complementary pulling down and pulling up of bitlines bit and bitB are reinforced by each other, thereby quickly and abruptly causing the voltages at bitlines bit and bitB to essentially reach the VDD and VSS voltages, respectively.

Figure 2:
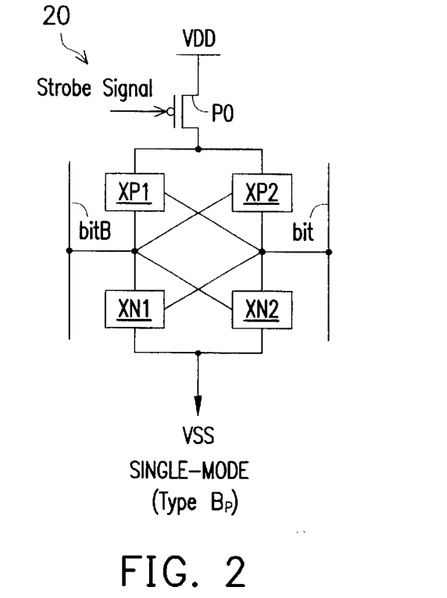
FIG. 2 is a diagram schematically illustrating a type B single-mode sense amplifier with a pull-up device.

FIG. 2 illustrates a type $B_P$ single-mode sense amplifier 20. For clarity, the same reference numbers are used among the drawings for elements that have the same or similar function or structure. Sense amplifier 20 is similar to sense amplifier 10 (FIG. 1) except that the enable device is implemented with P-channel transistor P0 instead of N-channel transistor N0 (FIG. 1), which is deleted. The N node is connected to the VSS line. The source and drain of P-channel transistor P0 are connected to the VDD line and the P node, respectively. Sense amplifier 20 operates in a manner substantially similar to that of sense amplifier 10, except that the pull-up path is formed by P-channel transistors P0 and one of P-channel transistors XP1 or XP2, whereas the pull-down path is formed by one of N-channel transistors XN1 or XN2. As will be appreciated by those skilled in the art, sense amplifier 20 will respond in a complementary manner to the logic level of the strobe signal, in comparison to sense amplifier 10 (FIG. 1).

Figure 3:
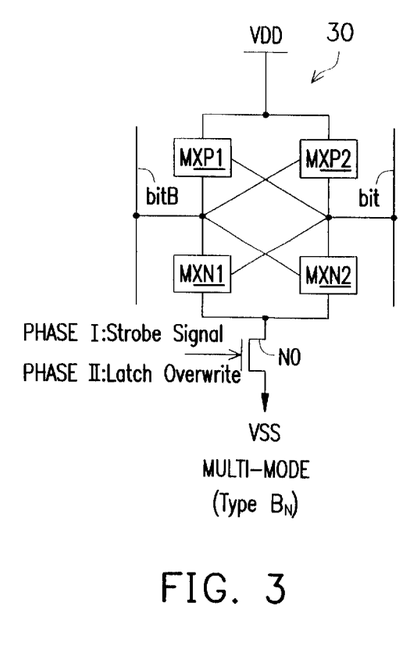
FIG. 3 is a diagram schematically illustrating a type B multi-mode sense amplifier with a pull-down device.

FIG. 3 illustrates a type $B_N$ multi-mode sense amplifier 30. Multi-mode sense amplifier 30 is essentially the same as single-mode sense amplifier 10 (FIG. 1), except that multi-mode sense amplifier 30 has at least two operational modes or phases. In one phase (referred to herein as Phase I), multi-mode sense amplifier 30 operates in essentially the same manner as sense amplifier 10 (i.e., enable device N0 is controlled by a strobe signal as previously described). In another phase (referred to herein as Phase II), multi-mode sense amplifier 30 can be overwritten. In Phase II, enable device N10 receives a latch-overwrite signal. In this example, the latch-overwrite signal is the same as the strobe signal. The latch-overwrite signal causes enable device N0 to be conductive for a sufficient time for a driving or upstream subcircuit or device to overwrite the state of multi-mode sense amplifier 30. In particular, the driving device is stronger than multi-mode sense amplifier 30. This allows the driving device to flip the state of multi-mode sense amplifier 30 if the new data on the bitlines bit and bitB is different from the current data in multi-mode sense amplifier 30. As will be appreciated by those skilled in the art, Phase II operation only allows signal propagation in one direction along the bitlines.

Figure 4:
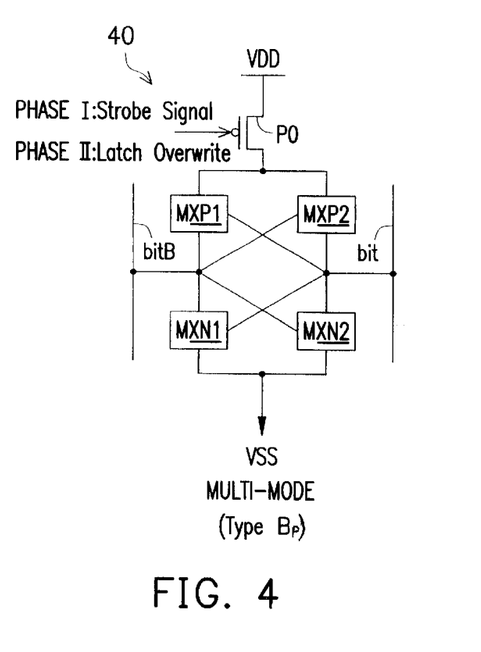
FIG. 4 is a diagram schematically illustrating a type B multi-mode sense amplifier with a pull-up device.

FIG. 4 illustrates a type $B_P$ multi-mode sense amplifier 40. Multi-mode sense amplifier 40 is essentially the same as multi-mode sense amplifier 30 (FIG. 3), except that in multi-mode sense amplifier 40, the enable device is implemented with P-channel transistor P0 instead of N-channel transistor N0 (FIG. 3). In Phase I, multi-mode sense amplifier 40 operates in essentially the same manner as sense amplifier 20 (FIG. 2). In Phase II, enable device P0 receives the latch-overwrite signal that allows multi-mode sense amplifier 40 to be overwritten in a similar but complementary manner as described above for multi-mode sense amplifier 30 (FIG. 3).

Figure 5:
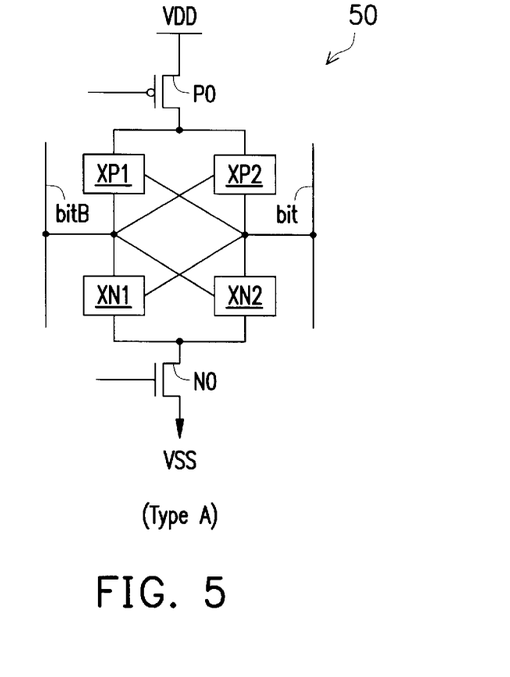
FIG. 5 is a diagram schematically illustrating a type A sense amplifier.

A type A sense amplifier has two enable devices receiving complementary strobe signals. FIG. 5 illustrates a type A sense amplifier 50. Sense amplifier 50 is substantially similar to sense amplifier 20 (FIG. 2) except that sense amplifier 50 also includes enable device N0 FIG. 1). Enable device P0 is connected to receive strobe signal A whereas enable device N0 is connected to receive complementary strobe signal B. In operation, strobe signals A and B are about simultaneously strobed to logic low and logic high levels, respectively. As a result, enable devices P0 and N0 are both activated, allowing type A sense amplifier 50 to amplify the differential signal present on bitlines bitB and bit.

Figure 6:
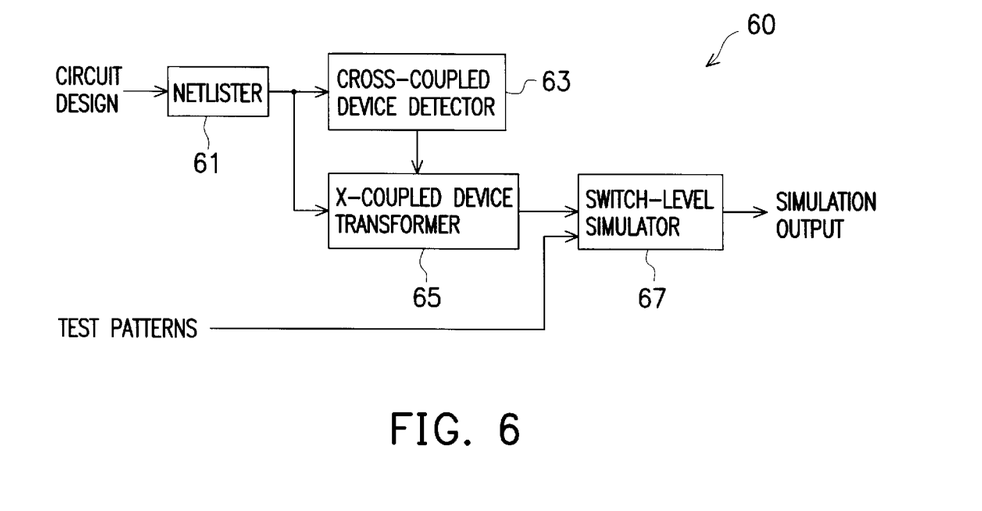
FIG. 6 is a functional block diagram illustrating switch level simulation system in accordance with one embodiment of the present invention.

Once all of the cross-coupled devices in the circuit are categorized, the circuit to can be simulated using the switch level simulation system according to present invention. FIG. 6 illustrates one embodiment of a switch level simulation system 60 in accordance with the present invention. Switch level simulation system 60 includes a netlister 61, a cross-coupled device detector 63, a cross-coupled device transformer 65 and a switch level simulator 67. Netlister 61 is configured to receive a circuit design provided by the user. In this embodiment, the circuit design is in the form of a schematic diagram of the circuit, from which netlister 61 generates a netlist. Such netlister tools are commercially available. In one embodiment, netlister 61 is implemented using a VHDL design tool available from Cadence.

Cross-coupled device detector 63 and cross-coupled device transformer 65 are configured to receive the netlist from netlister 61. Cross-coupled device detector 63 searches the netlist for cross-coupled devices and determines the type of each found cross-coupled device. One embodiment of cross-coupled device detector 63 is described in conjunction with FIG. 7 and Tables 1 and 2 below. Based on the type of each cross-coupled device, cross-coupled device transformer 65 may then transform each found cross-coupled device into a transformed cross-coupled device. In this embodiment, cross-coupled device detector 63 categorizes each found cross-coupled device as either a type A (an example of which is described above in conjunction with FIG. 5) or type B device (examples of which are described above in conjunction with FIGS. 1–4).

Cross-coupled device transformer 65 then transforms all of the type B devices. More particularly, cross-coupled device transformer 65 performs strength allocation techniques on all of the multi-mode cross-coupled devices. In this embodiment, the strengths of the multi-mode cross-coupled devices are weakened. In addition, cross-coupled device transformer 65 inserts a mirrored enable device (a device of the same conductivity-type as the enable device) at the node directly coupled to the external voltage source line (i.e., VDD or VSS) to transform the cross-coupled device. One embodiment of cross-coupled device transformer 65 is described below in conjunction with FIG. 7 and Tables 3 and 4 below. Several examples of transformed cross-coupled devices are described in conjunction with FIGS. 9–11 below. In this embodiment, for each type B cross-coupled device, cross-coupled device transformer 65 inserts the mirrored enable device into the netlist at the appropriate node. Type A cross-coupled devices are left unchanged. Switch-level simulator 67 then performs the switch level simulation using the modified netlist from cross-coupled device transformer 65 and test patterns provided by the user.

Figure 7:
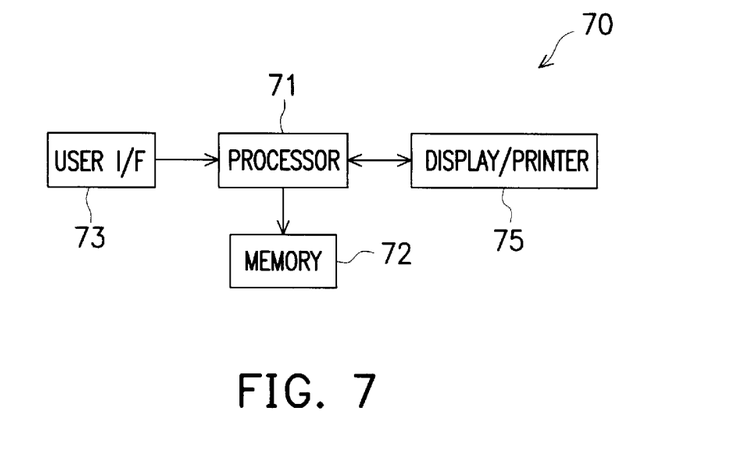
FIG. 7 is a block diagram illustrating an apparatus in accordance with one embodiment of the present invention implementing the system of FIG. 6.

FIG. 7 illustrates one embodiment of a hardware system 70 used to implement switch level simulation system 60 FIG. 6). System 70 includes a processor 71, a memory 72 (including cache, RAM, ROM, hard drives, floppy drives, optical drives, etc.), a user interface 73 and a display 75 (including monitors, LCDs, printers, etc.). In this embodiment, system 70 is implemented using a standard commercially available workstation, although any suitable general-purpose computer system may be used. User interface 73 is typically used to input data or instructions to processor 71. Generally, in response to the data and instructions from user interface 73, processor 71 executes programs and stores and manipulates data and instructions stored in memory 72. In this application, the user configures processor 71 to execute the aforementioned Verilog design software tool, which is stored in memory 72. Further, cross-coupled device detector and cross-coupled device transformer are also implemented in software, which is then executed using system 70.

Table 1 below illustrates a truth table configured in cross-coupled device detector 63 for use with the algorithm illustrated in Table 2, according to one embodiment of the present invention. Table 1 shows a truth table for assigning a type to a sense amplifier. Table 2 illustrates an algorithm to determining sense amplifier type (using Table 1) and mode-type (i.e., single mode or multi-mode) from a netlist.

TABLE 1

| n_Node_Vss="false" | | n_Node_Vss="true" | |
|---|---|---|---|
| p_Node_Vdd="false" | p_Node_Vdd="true" | p_Node_Vdd="false" | p_Node_Vdd="true" |
| SA Type A | SA Type $B_N$ | SA Type $B_P$ | Latch |

TABLE 2

```
#identify sense-amplifiers and determine whether single-mode or multi-
#mode operation
single_mode="false";
$multiple_mode="false";
$p_Node_Vdd="false";
$n_Node_Vss="false";
for ($i = 0 to ($number_of_instances -1))
begin
   if ($instance_name[i] eq ("XP/d+" or "XN/d+"))
   then $single mode = "true";
   if ($instance_name[i] eq ("MXP/d+" or "MXN/d+"))
   then begin
      $multi_mode = "true";
      replace_normalCell_with_weakCell;
   end
#determine sense-amplifier type and create virtual Vdd/Vss nodes
   if(($single_mode eq "true") or ($multi_mode eq "true"))
   then
      if($instance_source[i] eq "Vdd" or $instance_drain[i] eq "Vdd")
      then $p_Node_Vdd = "true"; #type $B_N$;
      elseif ($instance_source[i] eq "Vss" or $instance_drain[i] eq "Vss")
      then $n_Node_Vss = "true"; #type $B_P$;
      if ($instance_source[i] eq "Vdd")
      then $instance_source[i] = "Vdd0";
      elseif($instance_drain[i] eq "Vdd")
      then $instance_drain[i] = "Vdd0";
      elseif ($instance_source[i] eq "Vss")
      then $instance_source[i] = "Vss0");
```

TABLE 2-continued

```
    elseif ($instance_drain[i] eq "Vss")
      then $instance_drain[i] = "Vss0";
    end
  end
  if ($p_Node_Vdd eq "true")
  then mirror_pull_down;
  if ($n_Node_Vss eq "true")
  then mirror_pull_up;
```

Tables 3 and 4 illustrate algorithms for transforming cross-coupled devices and inserting the transformed devices into a netlist, according to one embodiment of the present invention. Table 3 illustrates an algorithm for transforming type $B_N$ sense amplifiers and Table 4 illustrates an algorithm for transforming type $B_P$ sense amplifiers

TABLE 3

```
#subroutines for pull-up/pull-down device insertion
sub mirror_pull_down {
for ( $i=0 to ($number_of_instances -1))
begin
  #find pull-down device:
  if((instance_source[i] eq "Vss") or "$instance_drain[i] eq "Vss"))
  then begin
  #duplicate the pull-down device and insert it between Vdd and Vdd0,
  #the virtual Vdd node
    $instance[i] = $instance_cellName[i] +" "+$instance_name[i]_+
" "
+"(.gate("+$instance_gate[i]+")"+". source("+$instance_source[i]+")"
    +".drain("+instance_drain[i]+"));"+
    $instance_cellName[i]+" "+$instance_name[i]+"_mirror"
  +"(.gate("+$instance_gate[i]+")"+".source(Vdd)"+".drain(Vdd0));"
  end
end
}
```

TABLE 4

```
sub mirror_pull_up {
for ( $i = 0 to ($number_of_instances -1))
begin
  #find pull-up device:
  if ((instance_source[i] eq "Vdd") or ($instance_drain[i] eq "Vdd"))
  then begin
  #duplicate the pull-up device and insert it between Vss and Vss0,
  #the virtual Vss node
    $instance[i] = $instance_cellName[i]+" "+$instance_name[i]_+
" "
  +"(.gate("+$instance_gate[i]+")"+".source("+$instance_source[i]+")"
    +".drain("+$instane_drain[i]+"));"+
    $instance_cellName[i]+" "+$instance_name[i]+"_mirror"
  +"(.gate("+$instance_gate[i]+")"+".source(Vss)"+".drain(Vss0));"
  end
end
```

Figure 8:
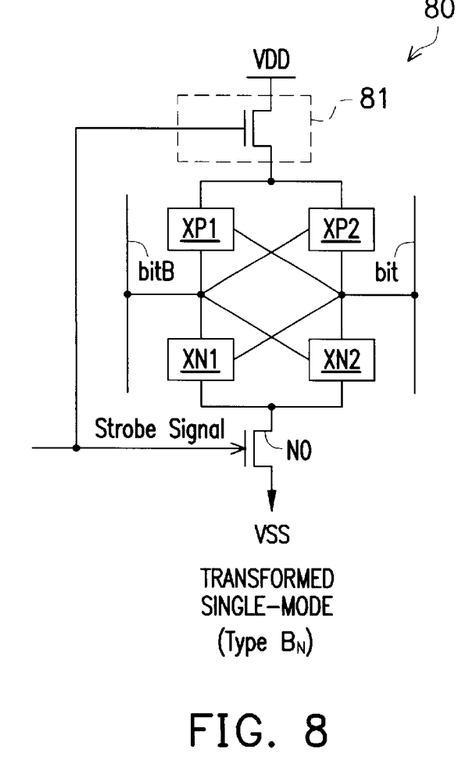
FIG. 8 is a diagram schematically illustrating a type B single-mode sense amplifier with a pull-down device transformed in accordance with one embodiment of the present invention.

FIGS. 8–11 illustrate examples of transformed cross-coupled devices, according the present invention. FIG. 8 illustrates a transformed type $B_N$ single-mode sense amplifier 80. Sense amplifier 80 is similar to sense amplifier 10 (FIG. 1) except that a mirrored enable device 81 is inserted between the VDD line and the P node. In this embodiment, mirrored enable device 81 is implemented with an N-channel transistor substantially identical to N-channel transistor N0. In light of the present disclosure, those skilled in the art will appreciate that as used herein, "mirrored enable device" generally refers to a device that is substantially identical to the enable device, and which is inserted to selectively couple the opposite external voltage source line to the cross-coupled device. Sense amplifier 80 performs the same logic function as sense amplifier 10 (FIG. 1), except that when the strobe signal is at a logic low level, mirrored enable device 81 presents a high impedance between the VDD line and the P node. Consequently, transformed cross-coupled device 80 presents a high impedance to the bitlines bitB and bit, thereby emulating the high impedance of the meta-stable state of a cross-coupled device. The change in voltage at the P node due to the threshold voltage of mirrored enable device 81 does not affect the switch level simulation. The high impedance presented to the bitlines allows switch level simulator 67 (FIG. 6) to simulate the functionality of a cross-coupled device with an accuracy that is comparable to that of analog simulators, while requiring significantly less simulation time. Furthermore, modeling a cross-coupled device using the technique of the present invention is advantageously much less complex, more accurate, and requires significantly less engineering resources compared to using conventional black box techniques.

Figure 9:
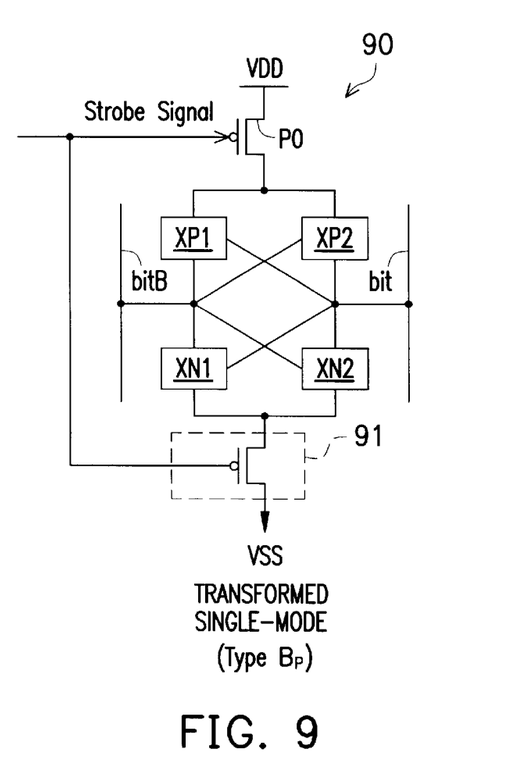
FIG. 9 is a diagram schematically illustrating a type B single-mode sense amplifier with a pull-up device transformed in accordance with one embodiment of the present invention.

FIG. 9 illustrates a transformed type $B_P$ single-mode sense amplifier 90. Sense amplifier 90 is similar to sense amplifier 80 (FIG. 8) except that a mirrored enable device 81 (FIG. 8) is deleted and mirrored enable device 91 is inserted between the VSS line and the N node. In this embodiment, mirrored enable device 91 is implemented with P-channel transistor substantially identical to P-channel transistor P0. Sense amplifier 90 performs the same logic function as sense amplifier 20 FIG. 2), except that when the strobe signal is at a logic high level, mirrored enable device 91 presents a high impedance between the VSS line and the N node. Consequently, transformed cross-coupled device 90 presents a high impedance to the bitlines bitB and bit, thereby emulating the high impedance of the meta-stable state of a cross-coupled device. The change in voltage at the N node due to the threshold voltage of mirrored enable device 91 does not affect the switch level simulation.

Figure 10:
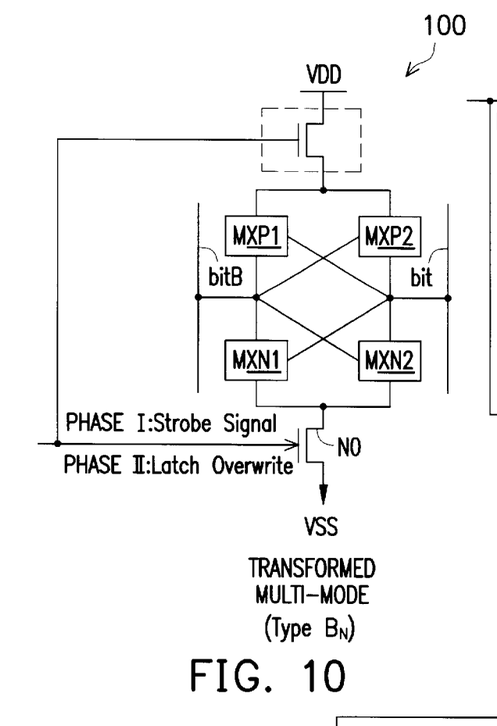
FIG. 10 is a diagram schematically illustrating a type B multi-mode sense amplifier with a pull-down device transformed in accordance with one embodiment of the present invention.
Figure 11:
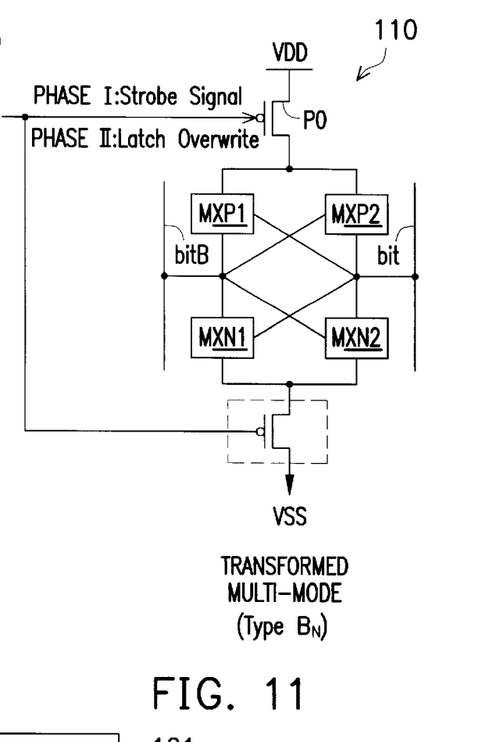
FIG. 11 is a diagram schematically illustrating a type B multi-mode sense amplifier with a pull-up device transformed in accordance with one embodiment of the present invention.

FIGS. 10 and 11 illustrate transformed type $B_N$ and type $B_P$ multi-mode sense amplifiers 100 and 110, respectively. In Phase I, sense amplifiers 100 and 110 perform substantially the same manner as described above for sense amplifier 80 (FIG. 8) and sense amplifier 90 FIG. 9). In Phase II, the enable devices and the mirrored enable devices receive a latch-overwrite signal, which is the same as a strobe signal in this embodiment. As previously described in conjunction with FIGS. 3 and 4, the new data is sent from upstream drivers and will force the state of the sense amplifier to match the new data. Multi-mode devices must be carefully constructed with proper strength, based on the flow of data, to be able to "flip" the stored data when driven by an upstream device during Phase II. In particular, the strength allocation is made to reflect the relative strength of the actual driver and receiver.

Figure 12:
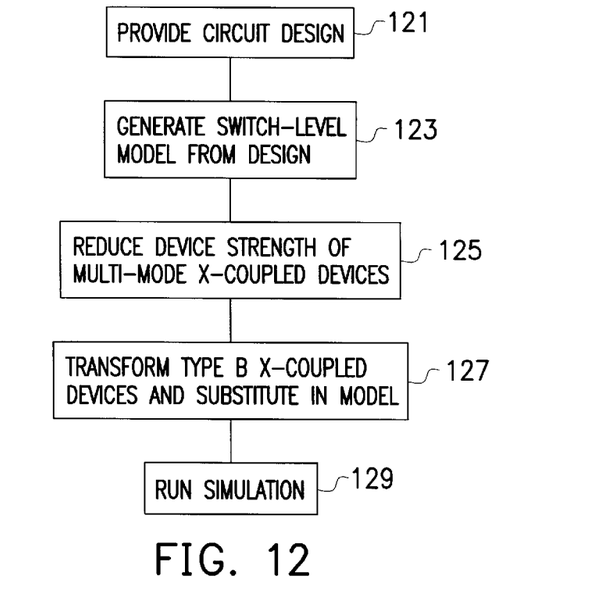
FIG. 12 is a flow diagram illustrating the operation of the system of FIG. 6, according to one embodiment of the present invention.

FIG. 12 illustrates the operation of the switch level simulation system 60 (FIG. 6), according to one embodiment of the present invention. Referring to FIGS. 6 and 12, switch level simulations system 60 operates as follows. In a step 121, the user inputs a circuit design to switch level system 60. In one embodiment, the circuit design is provided in the form of a schematic diagram using the aforementioned Verilog design tool. In constructing the circuit (i.e., the schematic diagram) the user labels for each cross-coupled device instantiated in the circuit design using the design tool. For example, in this embodiment, each instance name of a single mode sense amplifier includes the prefix "X", whereas each instance name of a multi-mode sense amplifier includes the prefix "MX".

In a step 123, a switch level model is created from the circuit design. In one embodiment, netlister 61 generates a netlist from the circuit design. In particular, a netlister function in the Verilog design tool is used to create a netlist from the schematic diagram. In this embodiment, cross-coupled device detector 63 searches the netlist for cross-coupled devices. In a next step 125, the multi-mode cross-coupled devices are replaced with weakened cross-coupled devices using standard strength allocation techniques. In one embodiment, the strength allocation is performed by cross-coupled device detector 63. In view of this disclosure, those skilled in the art can implement this function in cross-coupled device transformer 65 or other functional block, without undue experimentation.

In a step 127, the cross-coupled devices are transformed by adding mirrored enable devices to the cross-coupled devices. In one embodiment, for type $B_N$ cross-coupled devices, cross-coupled device transformer 65 modifies the netlist by inserting an N-channel transistor at the cross-coupled device's VDD node. This N-channel transistor serves as the mirrored enable device for single mode and multi-mode type $B_N$ cross-coupled devices. Similarly, for type $B_P$ cross-coupled devices, cross-coupled device transformer 65 modifies the netlist by inserting a P-channel transistor at the cross-coupled device's VSS node. This P-channel transistor serves as the mirrored enable device for both single mode and multi-mode type $B_P$ cross-coupled devices. Alternatively, step 125 may be performed after step 127.

Then in a step 129, a switch level simulation is performed using the modified netlist and test patterns provided by the user. In this embodiment, the switch level simulator included in the Verilog design tool is used to perform the simulation. As will be appreciated by those skilled in the art, the cross-coupled device can be any circuit having a cross-coupled transistor pair (or pairs) and, thus, can be different from the sense amplifiers described above in conjunction with FIGS. 1–4.

Figure 13:
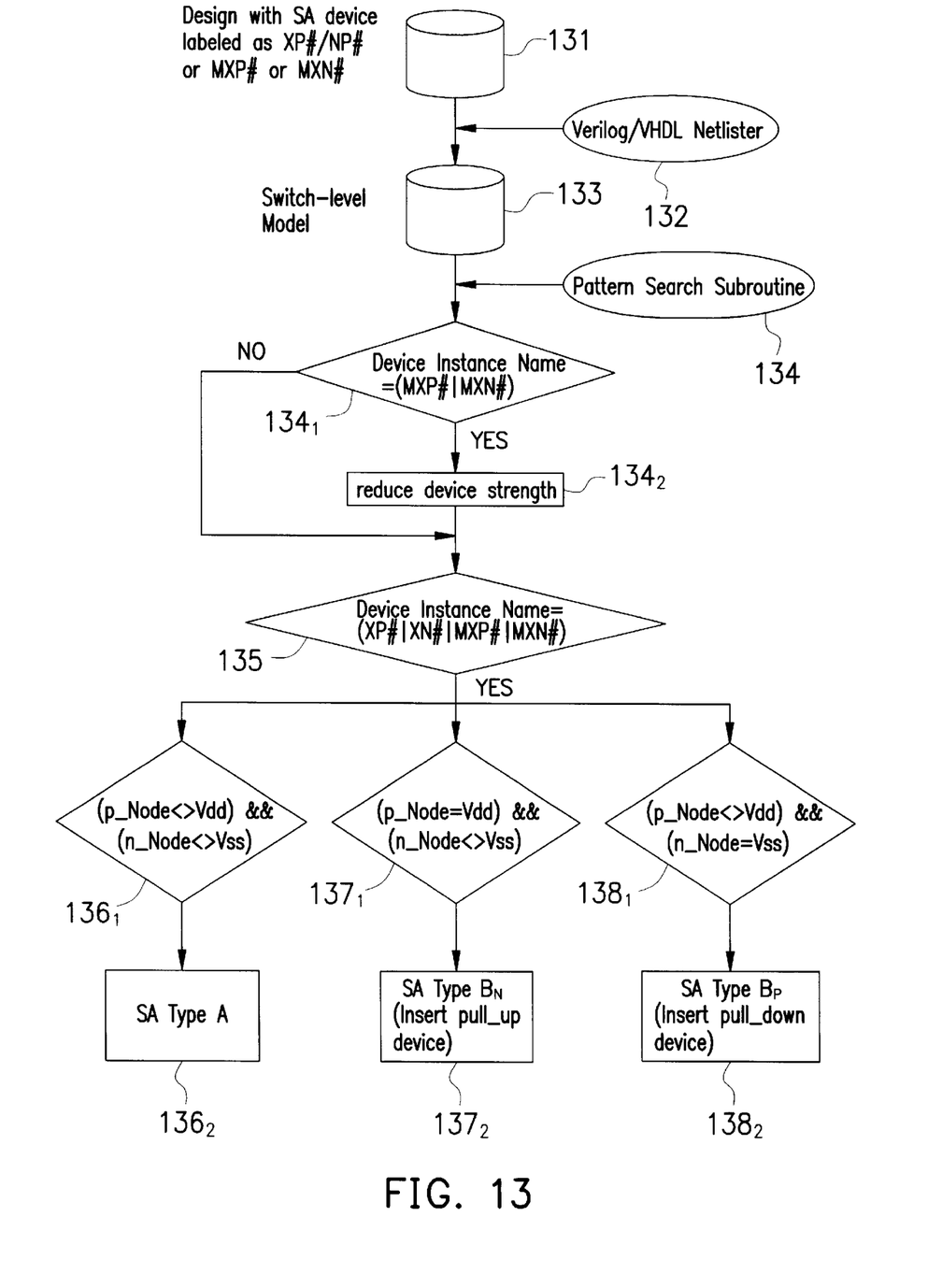
FIG. 13 is a diagram illustrating the design flow for a sense amplifier switch level simulation.
Figure 14A:
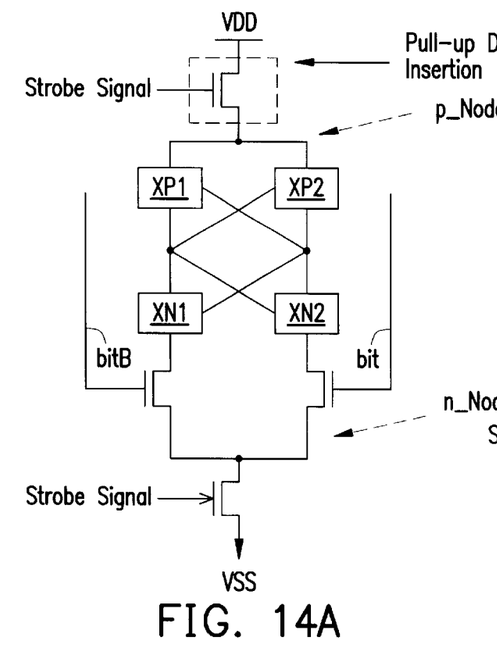
FIGS. 14A–14E are diagrams schematically illustrating exemplary cross-coupled device circuits that can be modeled using the present invention.
Figure 14B:
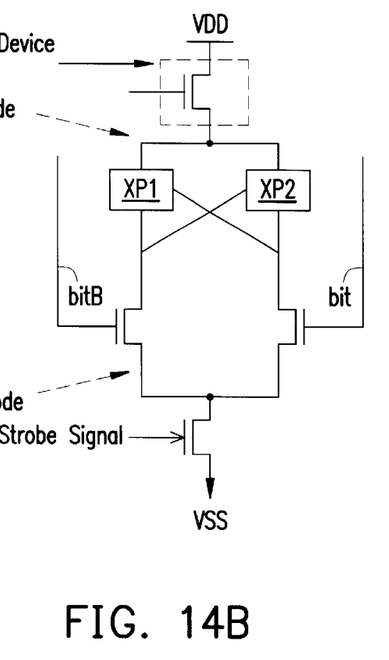
Figure 14C:
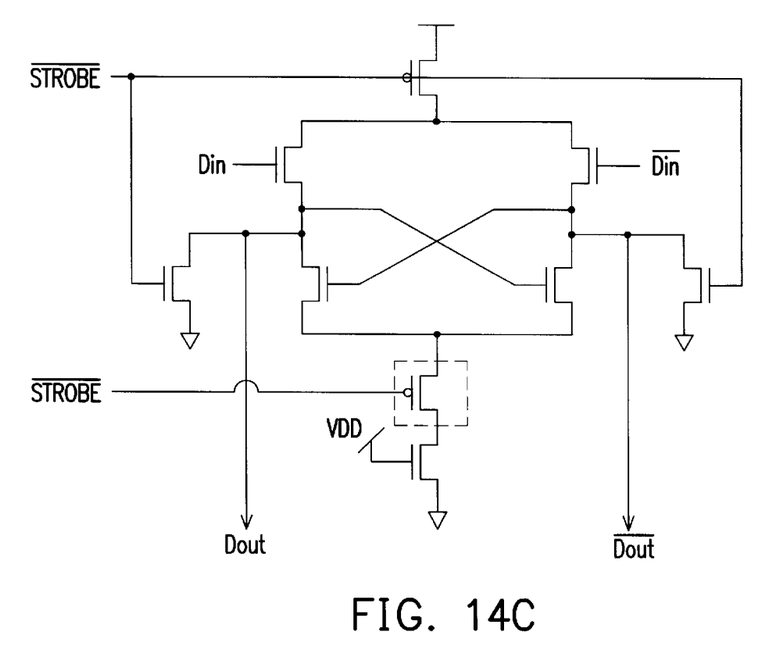
Figure 14D:
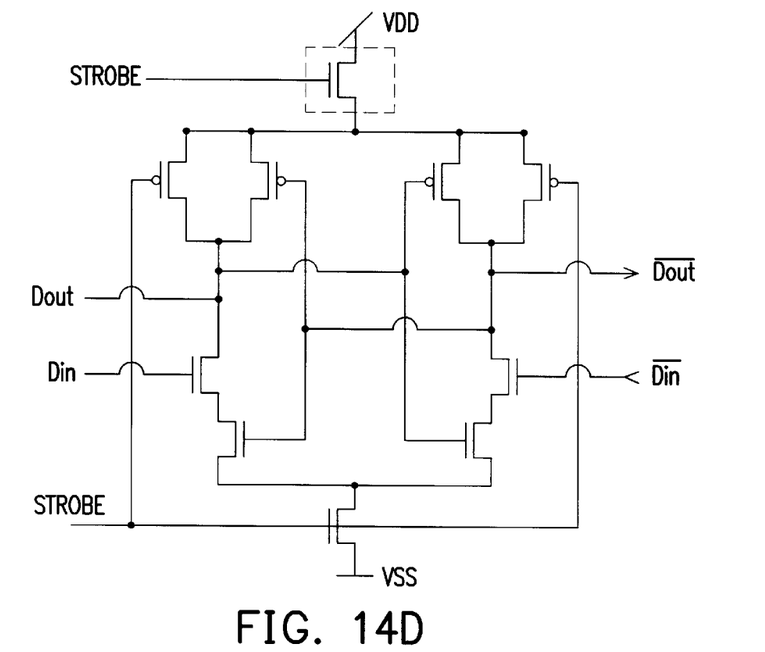
Figure 14E:
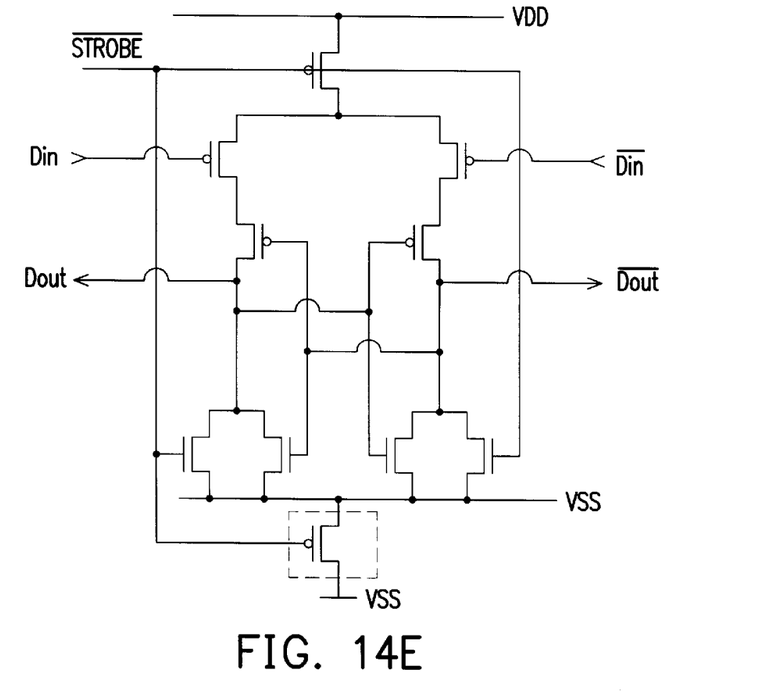

FIG. 13 illustrates in more detail the design flow for a sense amplifier switch level simulation, according to one embodiment of the present invention. In this embodiment, the circuit design is provided in a file 131 as a schematic diagram, which can be inputted and stored in memory 72 (FIG. 7). As previously described, the schematic diagram is created with all of the sense amplifiers labeled as either single or multi-mode sense amplifiers. Then a VHDL (or Verilog) netlister 132 is used to generate a netlist from the circuit design file.

A pattern search routine is performed on the netlist to find all of the sense amplifiers in the circuit design. In this embodiment, cross-coupled device detector 65 (FIG. 6) is configured with a pattern search routine as in Table 2. In this embodiment, the label of the device is analyzed to detect whether the device is a multi-mode sense amplifier, as indicated in decision block $134_1$. The multi-mode sense amplifier is then reduced in strength, as indicated by block $134_2$.

Then the label of the device (whether or not block 134 was performed) is then analyzed to determine whether they are a sense amplifier, as indicated by decision block 135. The label is then analyzed to determine if both the P node is not connected to the VDD line and the N node is not connected to the VSS line, as indicated by decision block $136_1$. If this is the case, then the sense amplifier is categorized as a type A sense amplifier as indicated by block $136_2$. As described above, type A sense amplifiers are not transformed. Otherwise, the label is analyzed to determine if the P node is connected to the VDD line and the N node is not connected to the VSS line, as indicated by decision block $137_1$. If this is the case, the sense amplifier is categorized as a type $B_N$ sense amplifier, as indicated by block $137_2$. As previously described, type $B_N$ sense amplifiers are transformed by inserting a mirrored N-channel enable device at the P node. Tables 5 and 6 below illustrates the netlist of a type $B_N$ sense amplifier before and after the transformation.

TABLE 5

Before transformation:

module sa(bit, bitB, strobe);
input strobe;
inout bit,bitB;
supply1 Vdd;
supply0 Vss;
tranif1 N0 (.gate(strobe), .source(Vss), .drain(Vss0));
tranif0 XP1 (.gate(bit), .source(Vdd), .drain(bitB));
tranif0 XP2 (.gate(bitB), .source(Vdd), .drain(bit));
tranif1 XN1 (.gate(bit), .sourceVss0), .drain(bitB));
tranif1 XN2 (.gate(bitB), .source(Vss0), .drain(bit));
endmodule

TABLE 6

After transformation:

module sa(bit, bitB, strobe);
input strobe;
inout bit,bitB;
supply1 Vdd;
supply0 Vss;
tranif1 N0 (.gate(strobe), .source(Vss), .drain(Vss0));
tranif1 N0_mirror (.gate(strobe), .source(Vdd), .drain(Vdd0));
tranif0 XP1 (.gate(bit), .source (Vdd0), .drain(bitB));
tranif0 XP2 (.gate(bitB), .source(Vdd0), . drain(bit));
tranif1 XN1 (.gate(bit), .source(Vss0), .drain(bitB));
tranif1 XN2 (.gate(bitB), .source(Vss0), .drain(bit));
endmodule Otherwise, the label is analyzed to determine if the P node is not connected to the VDD line and the N node is connected to the VSS line, as indicated by decision block $138_1$. If this is the case, the sense amplifier is categorized as a type $B_P$ sense amplifier, as indicated by block $137_2$. As previously described, type $B_P$ sense amplifiers are transformed by inserting a mirrored P-channel enable device at the N node.

FIGS. 14A–14E are diagrams schematically illustrating exemplary cross-coupled device circuits that can be modeled using the present invention. The mirrored enable devices are indicated by dashed-lined boxes around the mirrored device. As shown by these examples, this technique can be advantageously used when the sources of a cross-coupled transistor pair are connected directly to a voltage source line. Inserting a mirrored enable device between the sources of cross-coupled transistor pair and the voltage source line allows the transformed circuit to emulate the high impedance presented during the meta-stable state of the cross-coupled transistor pair.

The embodiments of the switch level simulation system described above are illustrative of the principles of the present invention and are not intended to limit the invention to the particular embodiments described. For example, in light of the present disclosure, those skilled in the art can devise without undue experimentation embodiments using cross-coupled device circuits different from those described. Accordingly, while the preferred embodiment of the invention has been illustrated and described, it will be appreciated that various changes can be made therein without departing from the spirit and scope of the invention.

We claim:

1. A method of simulating an electronic circuit design with at least one cross-coupled device, the cross-coupled device being coupled to a data path and having an enable device that is selectively activated to enable the cross-coupled device, the method comprising:
provide a netlist of the electronic circuit design, wherein the netlist includes a label for the cross-coupled device;
searching the electronic circuit design for the label of a cross-coupled device;
replacing the cross-coupled device with a model of the cross-coupled device to form a modified netlist; and
performing a simulation of the modified netlist.

2. The method of claim 1, wherein the model of the cross-coupled device includes an added device that causes the model of the cross-coupled device to present a high impedance to the data path when the enable device is not activated.

3. The method of claim 1, further comprising categorizing the cross-coupled device into one of a plurality of types as a function of whether the cross-coupled device has a cross-coupled transistor pair with a node electrically connected to a voltage source line.

4. The method of claim 3 wherein replacing the cross-coupled device with a model further comprises adding in the model a device between the node and the voltage source line, the device being configured so as to be activated when the enable device is activated.

5. The method of claim 4 wherein the device is substantially identical to the enable device.

6. The apparatus of claim 4 wherein the sources of the transistors forming the cross-coupled transistor pair are connected to the node.

7. The method of claim 1 wherein the simulation is a switch level simulation.

8. The method of claim 1 wherein replacing the cross-coupled device with a model further comprises changing the strength of the cross-coupled device in the model when the cross-coupled device is one circuit of a pair of circuits coupled to the data line, the pair of circuits being configurable into a mode in which one of the circuits of the pair of circuits can overwrite the other circuit of the pair of circuits.

9. The method of claim 8, wherein the strength of the cross-coupled device is reduced in the model of the cross-coupled device and the mode is a latch overwrite mode in which the state of the cross-coupled device can be overwritten by the other circuit in the pair of circuits.

10. The method of claim 1, wherein replacing the cross-coupled device with a model further comprises leaving the cross-coupled device unchanged when the cross-coupled device does not have a cross-coupled transistor pair with a node electrically connected to a voltage source line.

11. A switch level simulation system comprising:
a netlister configured to receive a circuit design, wherein the netlister is configured to provide a netlist representing the circuit design;
a cross-coupled device detector coupled to the netlister, the cross-coupled device detector being configured to detect whether the circuit design includes a cross-coupled device;
a cross-coupled device transformer coupled to the cross coupled device detector, wherein the cross-coupled device transformer is configured to replace a detected cross-coupled device with a model of the cross-coupled device; and
a switch level simulator coupled to the cross-coupled device transformer.

12. The system of claim 11, wherein the circuit design is provided with a label for any cross-coupled device in the circuit design, the cross-coupled device detector being configured to detect the label.

13. The system of claim 11, wherein the cross-coupled device transformer is configured to add a device to the model of the cross-coupled device that causes the model of the cross-coupled device to present a high impedance to the data path when the enable device is not activated.

14. The system of claim 11, wherein the cross-coupled device detector is further configured to categorize the cross-coupled device into one of a plurality of types as a function of whether the cross-coupled device has a cross-coupled transistor pair with a node electrically connected to a voltage source line.

15. The system of claim 14 wherein the cross-coupled device transformer is further configured to add in the model a device between the node and the voltage source line, the device being configured so as to be activated when the enable device is activated.

16. The system of claim 11 wherein when the cross-coupled device is one circuit of a pair of circuits coupled to a data line, and the pair of circuits is configurable into a mode in which one of the circuits of the pair of circuits can overwrite the other circuit of the pair of circuits, the cross-coupled device transformer is configured to provide the model of the cross-coupled device with a strength that is different from the strength of the cross-coupled device in the circuit design.

17. The system of claim 16, wherein the strength of the cross-coupled device is reduced and the mode is a latch overwrite mode in which the state of the cross-coupled device can be overwritten by the other circuit in the pair of circuits.

18. The system of claim 11 wherein the cross-coupled device transformer is configured to leave the cross-coupled device unchanged in the netlist when the cross-coupled device does not have a cross-coupled transistor pair with a node electrically connected to a voltage source line.

19. A switch level simulation system comprising:
a netlister configured to receive a circuit design, wherein the netlister is configured to provide a netlist representing the circuit design, the circuit design including at least one cross-coupled device;
a cross-coupled device transformer coupled to the netlister, wherein the cross-coupled device transformer is configured to modify the netlist if the cross-coupled device has a cross-coupled transistor pair with a node electrically connected to a voltage source line, the cross-coupled device transformer modifying the netlist by inserting a transistor between the node and the voltage source line, the transistor being configured to be conductive when the cross-coupled device is enabled and to be substantially non-conductive when the cross-coupled device is not enabled; and
a switch level simulator coupled to receive the netlist from the cross-coupled device transformer.

20. The system of claim 19 further comprising a cross-coupled device detector coupled to the netlister and the cross-coupled device transformer, the cross-coupled device detector being configured to detect whether the circuit design includes a cross-coupled device.

21. The system of claim 19 wherein when the cross-coupled device is one circuit of a pair of circuits coupled to a data line, and the pair of circuits is configurable into a mode in which one of the circuits of the pair of circuits can overwrite the other circuit of the pair of circuits, the cross-coupled device transformer is configured to change in the netlist a strength of the cross-coupled device.

22. A method of performing a switch level simulation, the method comprising:

providing a netlist of a circuit design, the circuit design having at least one cross-coupled device;

modifying the netlist when the cross-coupled device has a cross-coupled transistor pair with a node electrically connected to a voltage source line, the modification including the addition of a transistor connected between the node and the voltage source line, the transistor being configured to be turned on when the cross-coupled device is enabled and to be turned off when the cross-coupled device is not enabled; and performing a switch level simulation of the circuit design using the modified netlist.

23. The method of claim 22 further comprising configuring a software tool to search the netlist for a cross-coupled device.

24. The method of claim 22 further comprising modifying the netlist by changing the strength of the cross-coupled device when the cross-coupled device is one circuit of a pair of circuits coupled to a data line, and the pair of circuits is configurable into a mode in which one of the circuits of the pair of circuits can overwrite the other circuit of the pair of circuits.

25. The method of claim 22 further comprising leaving the netlist unchanged with regard to the cross-coupled device when the cross-coupled device does not have a cross-coupled transistor pair with a node electrically connected to a voltage source line.

* * * * *